Dec. 26, 1950 C. E. KOONTZ, JR 2,535,076

RADIO AMPLIFIER CIRCUITS

Filed May 4, 1942

Inventor

Clarence E. Koontz, Jr.

By [signature]

Attorney

Patented Dec. 26, 1950

2,535,076

UNITED STATES PATENT OFFICE 2,535,076

RADIO AMPLIFIER CIRCUITS

Clarence E. Koontz, Jr., Washington, D. C.

Application May 4, 1942, Serial No. 441,733

4 Claims. (Cl. 179—171)

(Granted under the act of March 3, 1883, as amended April 30, 1928; 370 O. G. 757)

This invention relates broadly to radio amplifier circuits and more particularly to improved coupling circuits for radio amplifiers. The design of amplifier circuits of radio receivers must take into account not only the desired gain and desired frequency response but also the operating conditions under which the radio amplifier circuits will be utilized. In some radio applications, radio receivers are operated in close proximity to radio transmitters which generate pulses of radio frequency at periodic or aperiodic intervals, between which it is necessary that the receiver be capable of detecting signals of extremely low magnitude compared to the magnitude of the signals generated by the transmitter closely associated therewith. In such applications, it is necessary to so design the receivers and particularly the amplifier circuits thereof to permit of rapid recovery from saturation and in addition to obtain the desired gain and frequency response characteristics. This is particularly true under those conditions such as in echo-ranging where a transmitted pulse of very large amplitude and approximately 1 to 5 microseconds in duration is repeated at intervals of 100 or more microseconds, and where it is desired that the receiver be able to detect very weak signals during the off-period of the transmitter and within a very few microseconds of the on-period of the transmitter.

Accordingly, it is an object of this invention to provide radio amplifier circuits having improved recovery from saturation.

It is a further object of this invention to provide radio amplifier circuits having high gain and maximum desired frequency response.

Another object of this invention is to provide improved radio receiver circuits having new and useful input coupling circuits.

A still further object of this invention is to provide, in a radio amplifier circuit, an improved combination of resistance, inductance and capacity in the coupling circuits thereof.

Another object of this invention is to provide improved input coupling circuits for radio amplifiers having low resistance and low power loss.

Other objects of this invention will be apparent from a careful consideration of the following description when taken together with the accompanying drawings in which.

Figure 1:
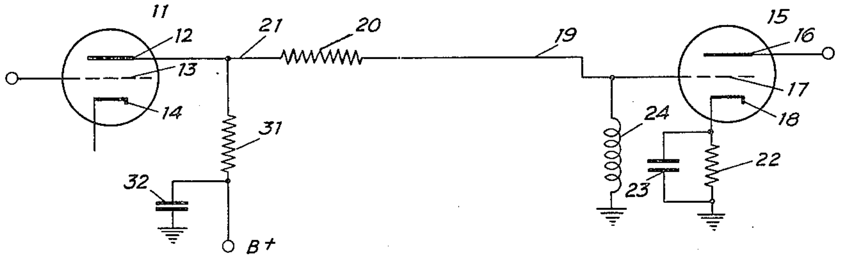
Fig. 1 is a diagrammatic illustration of one particular embodiment of this invention.

When a signal of high voltage is impressed on a receiver circuit, saturation occurs and blocking results due to the storage of electrical energy in the elements of the circuit. When the incoming signal terminates, the receiver circuit does not recover from saturation until the excessive electrical energy stored in the various elements of the circuit has been dissipated throughout the whole circuit. The time necessary for recovery from saturation depends upon the amount of energy stored in the elements of the circuit, and this in turn depends upon the capacity, inductance and resistance of the elements of the circuit. A circuit having negligible inductance and capacity would therefore recover from saturation in the shortest time interval and the use of such a circuit would be advantageous if the necessary gain and frequency response could be obtained.

Normal methods of coupling amplifier stages to preceding stages in a radio receiver comprise the use of resistance-capacitance, inductance-capacitance and transformer coupling. Since the use of any of these methods of coupling may introduce appreciable capacitance and/or inductance into the circuit, it will be observed that such methods of coupling are sometimes not adaptable in receiver circuits which must recover rapidly from signals of high voltage recurring at frequent intervals.

The use of direct coupling between stages of a radio receiver provides a circuit having negligible inductance and capacitance. However, direct coupling has a number of disadvantages. Since the direct current voltage on the grid of the electron tube in the amplifier stage is equal to the direct current voltage on the anode of the previous stage, a multi-stage receiver circuit would make necessary increasing anode voltages for each stage and attendant high voltage power supplies. Additionally, in direct coupled circuits slight variations in direct current voltages are amplified progressively through a multi-stage amplifier circuit thereby frequently resulting in regeneration and so-called "motor boating." These and other disadvantages inherent in such circuits make inadvisable the use of simple direct coupling between stages.

It has now been found that direct coupling may be employed between the anode of the preceding stage and the grid of the amplifier stage if a resistor is connected in series therewith in accordance with the teachings of this application.

Referring now with particularity to the drawings, in which like reference numerals are used to designate like elements, the reference numeral 11 designates an electron tube, which may be any type of a multi-element tube, having anode 12, a grid 13, and a cathode 14, and which may serve either as a detector tube or an amplifier tube in the stage preceding the amplifier stage desired to be coupled thereto. The reference numeral 15 designates another electron tube serving as the amplifier tube in the amplifier stage, and which likewise may be any type of a multi-element amplifying tube, having an anode 16, a grid 17 and a cathode 18.

The grid of the amplifier tube 15 and the plate 12 of the electron tube of the preceding stage are directly coupled by the leads 19 and 21, and the resistance 20, which coupling may be hereinafter referred to as direct resistance coupling. Connected in the cathode circuit of the amplifier 15 is a self-bias network, comprising the shunt combination of resistance 22 and capacitance 23, which functions to maintain constant operating bias on the tube despite certain finite variations in the steady state potential at grid 17.

Figure 2:
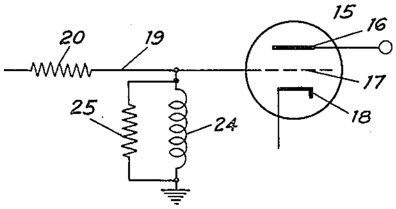
Figs. 2 and 3 illustrate modifications of the embodiment shown in Fig. 1.
Figure 3:
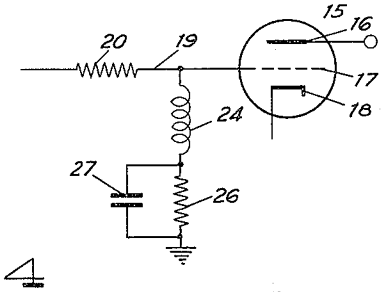

In Figs. 1, 2 and 3, the reference numeral 24 designates a radio frequency choke having, as its principal characteristic, a high ratio of inductance to capacitance and positioned between the grid 17 of electron tube 15 and ground in the grid return circuit of the amplifier stage. Other characteristics of the radio frequency choke 24 will be more fully set forth hereinafter.

The grid return circuit of the amplifier stage, as shown in Fig. 1, may be modified by the addition of a resistor 25 in parallel with the radio frequency choke 24, as shown in Fig. 2, or by the addition of a resistor 26 in series with the radio frequency choke 24 and a condenser 27 in parallel with the resistor 26, as shown in Fig. 3. In all other respects the circuits and elements associated with Figs. 2 and 3 are similar to those shown in Fig. 1.

Figure 4:
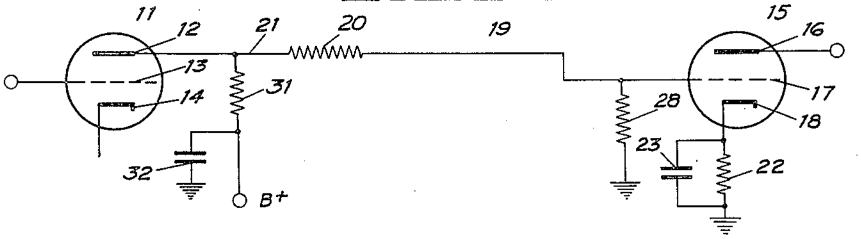
Fig. 4 is a diagrammatic illustration of another embodiment of this invention.

In Fig. 4, there is shown another embodiment of the present invention, in which the radio frequency choke 24 of Fig. 1, in the grid return circuit of the electron tube 15, is replaced by a resistor 28 in series between the grid 17 and ground. Other circuits and elements as illustrated in Fig. 4 are similar to those shown in Fig. 1.

With further reference to Figs. 1 and 4, the reference numeral 31 designates a resistor in series with the anode voltage supply for the anode 12 of the electron tube 11. The reference numeral 32 designates a by-pass condenser in the anode circuit between the resistor 31 and ground.

Figure 5:
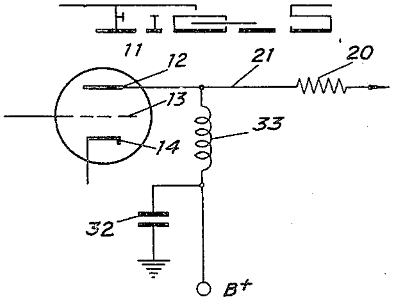
Figs. 5 and 6 illustrate modifications of the embodiment shown in Fig. 4.
Figure 6:
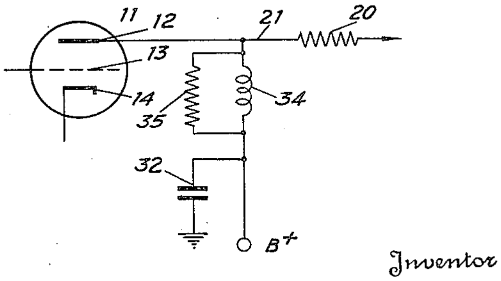

The anode voltage supply circuit for the anode 12 of electron tube 11 in the stage preceding the amplifier stage as shown in Fig. 4 may be modified by the substitution for the resistor 31 of Fig. 4, of a radio frequency choke 33 as shown in Fig. 5, or, as shown in Fig. 6, by the substitution for the resistor 31 of a radio frequency choke 34 with a resistor 35 in parallel with said radio frequency choke. In all other respects, the circuits and elements associated with Figs. 5 and 6 are similar to those shown in Fig. 4.

When the foregoing circuits are utilized in a radio receiver there is obtained not only amplification with high gain and desired frequency response, but also a very rapid recovery from saturation occurring when a signal of high voltage is impressed on the receiver circuit.

When a signal of high voltage and of short duration, such as those used in echo ranging, is received in a receiver incorporating circuits such as those described and illustrated above, the direct resistance coupling feature of these circuits results in the storing of only negligible quantities of electrical energy therein, and therefore a rapid recovery from saturation.

The resistor in series between the anode of the preceding stage and the grid of the amplifier stage not only lowers the voltage applied to the latter, but, in conjunction with associated elements in the anode circuit of the preceding stage and the grid return circuit of the amplifier stage, functions to suppress oscillations arising when a circuit is released from a saturated condition by the termination of an incoming saturating signal. The radio frequency choke 24 of Figs. 1, 2 and 3, positioned in the grid return circuit of the amplifying tube 15 raises the grid return impedance of the amplifier and thus prevents loss of gain.

The ratio of inductance to capacitance of the radio frequency choke must be high in order that its period will be short and its impedance high. Where only high frequency response is desired, the radio frequency choke must have minimum resistance. Critical damping of the choke 24 is obtained by the proper choice of the resistances 20 and 31.

For example, in an amplifier designed for pulse amplification, such as may be employed in echo ranging, it has been found convenient to employ an amplifier designed for a band width of approximately 50 to 300 kilocycles, this band with presenting an adequate visual indication of echo signals on a cathode ray oscilloscope for the pulse length used. In amplifiers in which the features of this invention have been incorporated, with resultant very high gain, rapid recovery and desired frequency response, radio frequency chokes having an inductance of approximately 50 millihenrys and a distributed capacity of less than 10 micromicrofarads have been found satisfactory.

In these amplifier circuits, the resistors 20 and 31 were of the order of 12,000 ohms and 5000 ohms respectively to obtain the necessary damping.

In lieu of the radio frequency choke 24 in the grid return circuit of the amplifier tube 15, the resistor 28, as shown in Fig. 4 may be used.

Very rapid recovery from saturation can be obtained with the circuits of Figs. 4, 5 and 6, although the gain resulting therefrom is generally not as high as that obtained where there is used in the grid return circuit a radio frequency choke, such as shown in Figs. 1, 2 and 3.

In several amplifiers having rapid recovery from saturation, and relatively good gain, utilizing the circuits of Figs. 4, 5 and 6, resistances of the value of approximately 20,000 ohms have been used for the resistor indicated by the reference numeral 28.

The modifications of Fig. 1, as shown in Figs. 2 and 3, are adaptable for use under certain circumstances, as will be apparent to those skilled in the art. For example, the use in Fig. 2 of the resistor 25, gives additional loading in the grid return circuit, and is therefore useful in a multistage amplifier to give desired overall frequency response in a high gain amplifier. The value of this resistor is dependent upon other features of the circuit.

In Fig. 3, the use of the resistance 26, and the by-pass condenser 27 in parallel therewith in the grid return circuit of the amplifier is particularly advantageous when the voltage from the preceding stage is excessive. The low frequency response of the amplifier circuit can be adjusted by the selection of the condenser 27, although in general this condenser should be a perfect by-pass. Values for the resistance 26 and the condenser 27 are chosen to effect the desired voltage drop and the desired frequency response.

Likewise the modifications of Fig. 4, as shown in Figs. 5 and 6 will be found to be advantageous in certain applications. Control of frequency response may be effected through the use of a radio frequency choke 33, in the anode circuit of the preceding stage, as shown in Fig. 5. A suitable choke for such use is one having characteristics similar to those set forth above for the radio frequency choke 24 of Figs. 1, 2 and 3.

Additional damping, if desired, may be obtained as shown in Fig. 6, by the adding of a resistor 35 in parallel with a radio frequency choke 34 in the anode circuit of the preceding stage. Representative values for the radio frequency choke 34 and the resistor 35 found satisfactory in one application are 10 millihenrys and 5000 ohms respectively.

It should be understood that the practice of the invention is not limited to the embodiments illustrated and described but is circumscribed only by the scope and limitations of the appended claims.

The invention described herein may be manufactured and used by or for the Government of the United States of America for governmental purposes without the payment of any royalties thereon or therefor.

I claim:

1. A radio pulse amplifier having quick recovery characteristics from the receipt of recurrent, saturating impulses, comprising at least two electron amplifier tubes each having anode, grid and cathode electrodes, a critically damped signal coupling network including a first shunt arm forming the anode load for one tube and a second shunt arm forming an alternating current grid return for the next tube, and a series arm connecting the anode of said one tube to the grid of said next tube, one shunt arm of said network comprising a high impedance radio frequency inductance coil and the other a resistance, said series arm consisting of a resistance, the resistances of said network having values relative to the impedance of said inductance to provide critical damping of said inductance.

2. A radio pulse amplifier as set forth in claim 1 wherein said high impedance radio frequency inductance coil comprises the shunt arm of said critically damped coupling network forming the alternating current grid return of said next tube.

3. A radio pulse amplifier as set forth in claim 1 wherein said high impedance radio frequency inductance coil comprises the shunt arm of said critically damped signal coupling network forming the anode load for said one tube.

4. A radio pulse amplifier having quick recovery characteristics from the receipt of recurrent, saturating impulses, comprising at least two electron amplifier tubes each having anode, grid and cathode electrode, a critically damped signal coupling network including a first shunt arm forming the anode load for one tube and a second shunt arm forming an alternating grid return for the next tube, and a series arm connecting the anode of said one tube to the grid of said next tube, one shunt arm of said network consisting of a high impedance radio frequency inductance coil and the other a resistance, said series arm consisting of a resistance, the resistances of said network having values relative to the impedance of said inductance to provide critical damping of said inductance.

CLARENCE E. KOONTZ, Jr.

REFERENCES CITED

The following references are of record in the file of this patent:

UNITED STATES PATENTS

| Number | Name | Date |
|---|---|---|
| 1,778,085 | Nyquist | Oct. 14, 1930 |
| 1,830,240 | Peterson | Nov. 3, 1931 |
| 2,056,000 | Callahan | Sept. 29, 1936 |
| 2,066,047 | Mathes | Dec. 29, 1936 |
| 2,075,604 | Finch | Mar. 30, 1937 |
| 2,112,705 | McCaa | Mar. 29, 1938 |
| 2,217,275 | Herold | Oct. 8, 1940 |
| 2,243,121 | Preisman | May 27, 1941 |
| 2,313,122 | Brubaker | Mar. 9, 1943 |